(12) United States Patent
Choi et al.

(10) Patent No.: US 7,758,760 B2
(45) Date of Patent: Jul. 20, 2010

(54) THIN FILM TRANSISTOR ARRAY PANEL AND METHOD OF MANUFACTURING THE SAME

(75) Inventors: Seung-Ha Choi, Siheung-si (KR); Min-Seok Oh, Yongin-si (KR); Hong-Kee Chin, Suwon-si (KR); Sang-Gab Kim, Seoul (KR); Yu-Gwang Jeong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 916 days.

(21) Appl. No.: 11/544,987

(22) Filed: Oct. 6, 2006

(65) Prior Publication Data

US 2007/0178413 A1 Aug. 2, 2007

(30) Foreign Application Priority Data

Jan. 27, 2006 (KR) .................... 10-2006-0008878

(51) Int. Cl.
*B44C 1/22* (2006.01)
(52) U.S. Cl. .................... 216/57; 216/37; 216/67; 257/59; 257/72; 257/347; 257/349; 438/706; 438/712; 438/719; 438/743; 349/43
(58) Field of Classification Search .................... 216/37; 257/59; 438/706; 349/43
See application file for complete search history.

(56) References Cited

U.S. PATENT DOCUMENTS

| | | | | |
|---|---|---|---|---|
| 5,962,896 | A * | 10/1999 | Yabuta et al. | 257/347 |
| 6,054,392 | A | 4/2000 | Ura et al. | |
| 6,432,830 | B1 * | 8/2002 | Merry | 438/706 |
| 6,583,065 | B1 * | 6/2003 | Williams et al. | 438/714 |
| 7,274,037 | B2 * | 9/2007 | Choi et al. | 257/59 |

2002/0171085 A1 11/2002 Suzawa et al.

(Continued)

FOREIGN PATENT DOCUMENTS

CN 1670909 A 9/2005

(Continued)

OTHER PUBLICATIONS

Patent Abstracts of Japan, Publication No. 2001-117116, Apr. 27, 2001, 1 p.

(Continued)

*Primary Examiner*—Duy-Vu N. Deo
*Assistant Examiner*—Maki Angadi
(74) *Attorney, Agent, or Firm*—Innovation Counsel LLP

(57) ABSTRACT

A thin film transistor (TFT) array panel and method of manufacturing the same are provided. The method includes forming a semiconductor layer and an ohmic contact layer over a gate line, forming a conductive layer on the ohmic contact layer, forming a first photosensitive layer pattern on the conductive layer, etching the conductive layer using the first photosensitive layer pattern as an etching mask, etching the ohmic contact layer and the semiconductor layer by a fluorine-containing gas, a chloride-containing gas, and an oxygen ($O_2$) gas using the first photosensitive layer pattern as an etching mask, removing the first photosensitive layer pattern to a predetermined thickness to form a second photosensitive layer pattern, and etching the conductive layer using the second photosensitive layer pattern as an etching mask to expose a part of the ohmic contact layer.

16 Claims, 23 Drawing Sheets

U.S. PATENT DOCUMENTS

2004/0099864 A1* 5/2004 Kong et al. .................. 257/72
2004/0183955 A1  9/2004 Souk et al.

FOREIGN PATENT DOCUMENTS

| | | |
|---|---|---|
| JP | 8-172202 | 7/1996 |
| JP | 2001-117116 | 4/2001 |
| JP | 2002-268085 | 9/2002 |
| JP | 2002-343811 | 11/2002 |
| JP | 2003-68755 | 3/2003 |
| JP | 2004-111991 | 4/2004 |
| JP | 2005-150710 | 6/2005 |
| KR | 10-0261974 | 3/1999 |
| KR | 2001-0046039 | 6/2001 |
| KR | 2001-0081675 | 8/2001 |
| KR | 2002-0034284 | 6/2002 |
| KR | 2002-0055787 | 7/2002 |
| KR | 2004-0043086 | 5/2004 |
| KR | 2004-0066282 | 7/2004 |
| KR | 2004-0091484 | 10/2004 |

OTHER PUBLICATIONS

Patent Abstracts of Japan, Publication No. 2002-268085, Sep. 18, 2002, 1 p.

Patent Abstracts of Japan, Publication No. 2002-343811, Nov. 29, 2002, 1 p.

Patent Abstracts of Japan, Publication No. 2003-068755, Mar. 7, 2003, 1 p.

Patent Abstracts of Japan, Publication No. 2004-111991, Apr. 8, 2004, 2 pp.

Patent Abstracts of Japan, Publication No. 08-172202, Jul. 2, 1996, 1 p.

Patent Abstracts of Japan, Publication No. 2005-150710, Jun. 9, 2005, 2 pp.

Korean Patent Abstracts, Publication No. 100261974, Apr. 25, 2000, 1 p.

Korean Patent Abstracts, Publication No. 1020010046039, Jun. 5, 2001, 1 p.

Korean Patent Abstracts, Publication No. 1020010081675, Aug. 29, 2001, 1 p.

Korean Patent Abstracts, Publication No. 1020020034284, May 9, 2002, 1 p.

Korean Patent Abstracts, Publication No. 1020020066787, Jul. 10, 2002, 1 p.

Korean Patent Abstracts, Publication No. 1020040043086, May 22, 2004, 1 p.

Korean Patent Abstracts, Publication No. 1020040066282, Jul. 27, 2004, 1 p.

Korean Patent Abstracts, Publication No. 1020040091484, Oct. 28, 2004, 1 p.

* cited by examiner

THIN FILM TRANSISTOR ARRAY PANEL AND METHOD OF MANUFACTURING THE SAME

CROSS-REFERENCE TO RELATED APPLICATION

This application claims priority to and the benefit of Korean Patent Application No. 10-2006-0008878 filed in the Korean Intellectual Property Office on Jan. 27, 2006, the entire contents of which are incorporated herein by reference.

BACKGROUND (a) Field of the Invention

The present invention relates to a thin film transistor (TFT) array panel and a method of manufacturing the same.

(b) Description of the Related Art

A liquid crystal display (LCD) is one of the most widely used flat panel displays (FPD). An LCD includes two substrates on which electrodes are formed and a liquid crystal layer that is interposed therebetween so that a voltage is applied to the electrodes to re-arrange the liquid crystal molecules of the liquid crystal layer and thereby control the amount of transmitted light.

Among the various types of LCDs, an LCD in which field generating electrodes are provided in two display panels is mainly used. In this type of LCD, a plurality of pixel electrodes are arranged in a matrix on one display panel (hereinafter, referred to as a thin film transistor array panel) and the other display panel (hereinafter, referred to as a common electrode panel) is covered with one common electrode. Different voltages are respectively applied to the pixel electrodes in the LCD, to display an image. Therefore, thin film transistors (TFT) are formed in the display panel for switching the voltages applied to the pixel electrodes. The TFTs have three terminal elements respectively connected to the pixel electrodes, gate lines for transmitting signals for controlling the TFTs, and data lines for transmitting the voltages to be applied to the pixel electrodes.

The TFTs operate as switching elements for transmitting the image signals transmitted through the data lines to the pixel electrodes or for preventing the image signals transmitted through the data lines from being transmitted to the pixel electrodes in accordance with scanning signals transmitted through the gate lines.

A TFT array panel includes a conductive layer including the gate lines and the data lines, and a plurality of thin films including a semiconductor layer and an insulation layer. Each of the thin films is patterned using a separate mask.

As each mask is sequentially added, photosensitive layer application, exposure, development, and cleaning processes must be repeated so that time and cost required for the processes remarkably increase. Therefore, it is desirable to reduce the number of masks used to increase efficiency and reduce cost. Consequently, a method of etching a metal data layer and a semiconductor layer with one mask is suggested.

Furthermore, the entire metal data layer of a typical TFT resides on the upper surface of the semiconductor layer and the semiconductor layer protrudes from the sides of the metal data layer. Therefore, areas of the semiconductor layer that are exposed to the light supplied by a light source increase so that photo leakage current increases and deteriorates the characteristics of the TFTs, which results in an after image that can be recognized. Consequently, an advantageous structure and method for reducing after images are suggested.

The above information disclosed in this Background section is only for enhancement of understanding of the background of the invention and therefore it may contain information that does not form the prior art that is already known in this country to a person of ordinary skill in the art.

SUMMARY

The present invention has been made in an effort to reduce the amount of the semiconductor layer that protrudes from the sides of a metal data layer and to thus improve the characteristics of the thin film transistors (TFT), which results in reduction of an after image.

A method of manufacturing a TFT array panel according to an embodiment of the present invention includes the processes of forming a semiconductor layer and an ohmic contact layer on a gate line, forming a conductive layer on the ohmic contact layer, forming a first photosensitive layer pattern on the conductive layer, etching the conductive layer using the first photosensitive layer pattern as an etching mask, etching the ohmic contact layer and the semiconductor layer by a fluorine-containing gas, a chloride-containing gas, and an oxygen ($O_2$) gas using the first photosensitive layer pattern as an etching mask, removing the first photosensitive layer pattern by a predetermined thickness to form a second photosensitive layer pattern, and etching the conductive layer using the second photosensitive layer pattern as an etching mask to expose a part of the ohmic contact layer. The flow ratio between the fluorine containing gas and the oxygen ($O_2$) gas may be in the range of about 4:1 to about 1:1.

A TFT array panel according to an embodiment of the present invention includes a substrate, gate lines formed on the substrate, a gate insulation layer formed on the gate lines, a semiconductor layer formed on the gate insulation layer, data lines formed on the semiconductor layer and including source electrodes, drain electrodes formed on the semiconductor layer to face the source electrodes, and pixel electrodes connected to the drain electrodes. The semiconductor layer may have the same planar shape as the data lines and the drain electrodes. The length of side projections of the semiconductor layer may be no more than 1.5 μm.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

Figure 1:
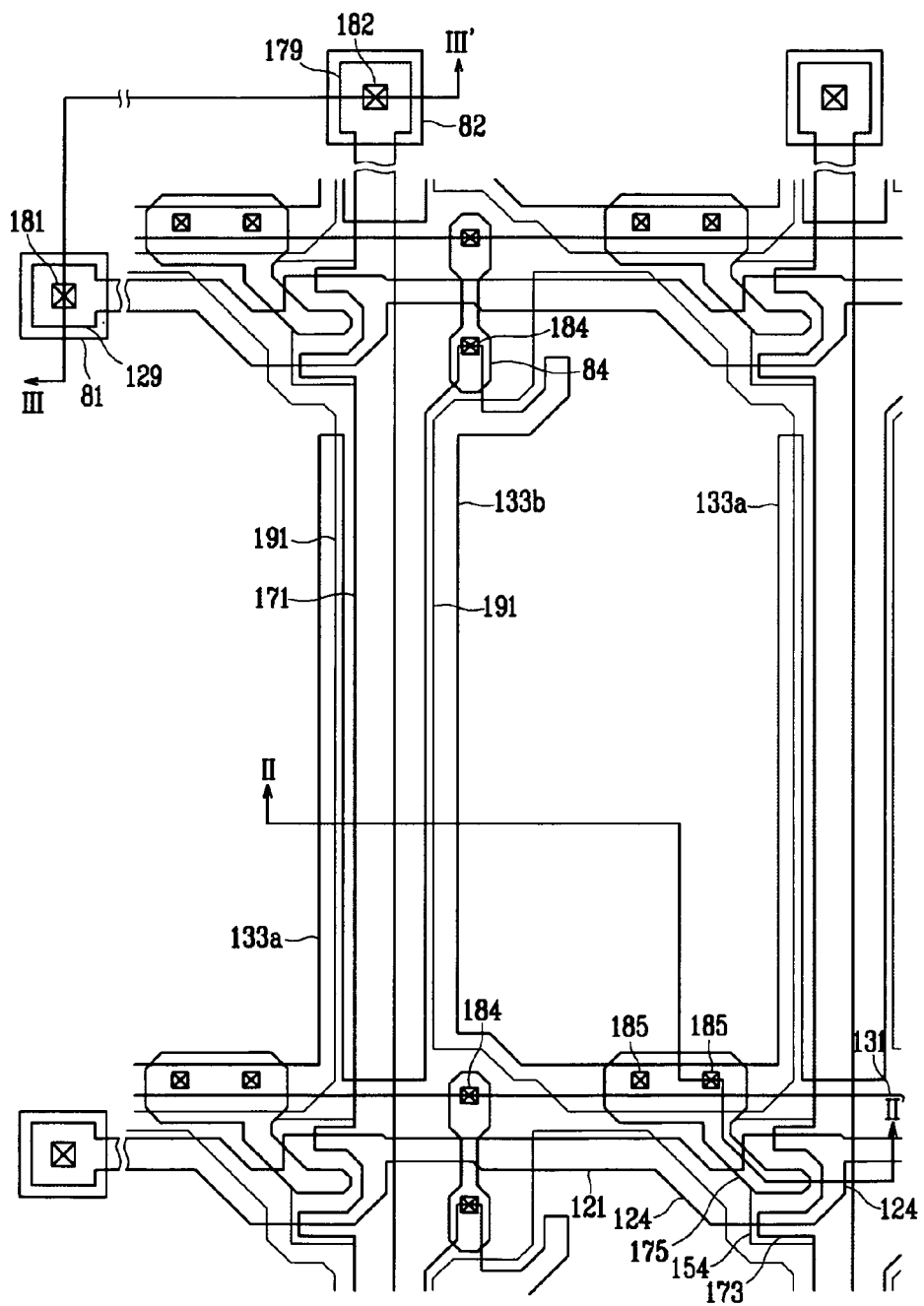
FIG. 1 is a layout view of a thin film transistor (TFT) array panel according to an embodiment of the present invention.

Embodiments of the present invention and their advantages are best understood by referring to the detailed description that follows. It should be appreciated that like reference numerals are used to identify like elements illustrated in one or more of the figures. It should also be appreciated that the figures may not be necessarily drawn to scale.

DETAILED DESCRIPTION

Hereinafter, embodiments of the present invention will be described in detail with reference to the accompanying drawings so as to be easily understandable to those skilled in the art. As those skilled in the art will realize, the described embodiments may be modified in various ways, all without departing from the spirit or scope of the present invention.

To clarify multiple layers and regions, the thicknesses of the layers may be enlarged in the drawings. Like reference numerals designate like elements throughout the specification. When it is said that any part, such as a layer, film, area, or plate is positioned on another part, it means the part may be directly on the other part or above the other part with at least one intermediate part. On the other hand, if any part is said to be positioned directly on another part it means that there is no intermediate part between the two parts.

Figure 2:
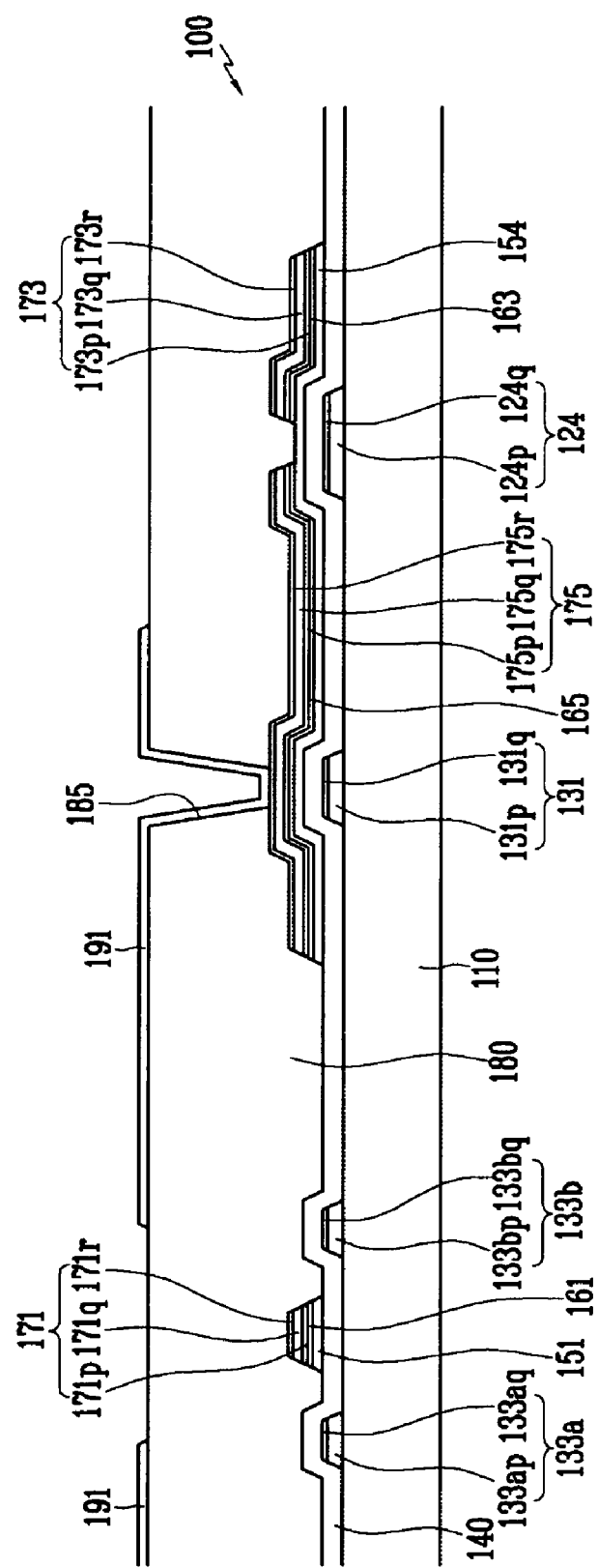
FIGS. 2 and 3 are cross-sectional views taken along the lines II-II' and III-III' of the TFT array panel of FIG. 1.
Figure 3:
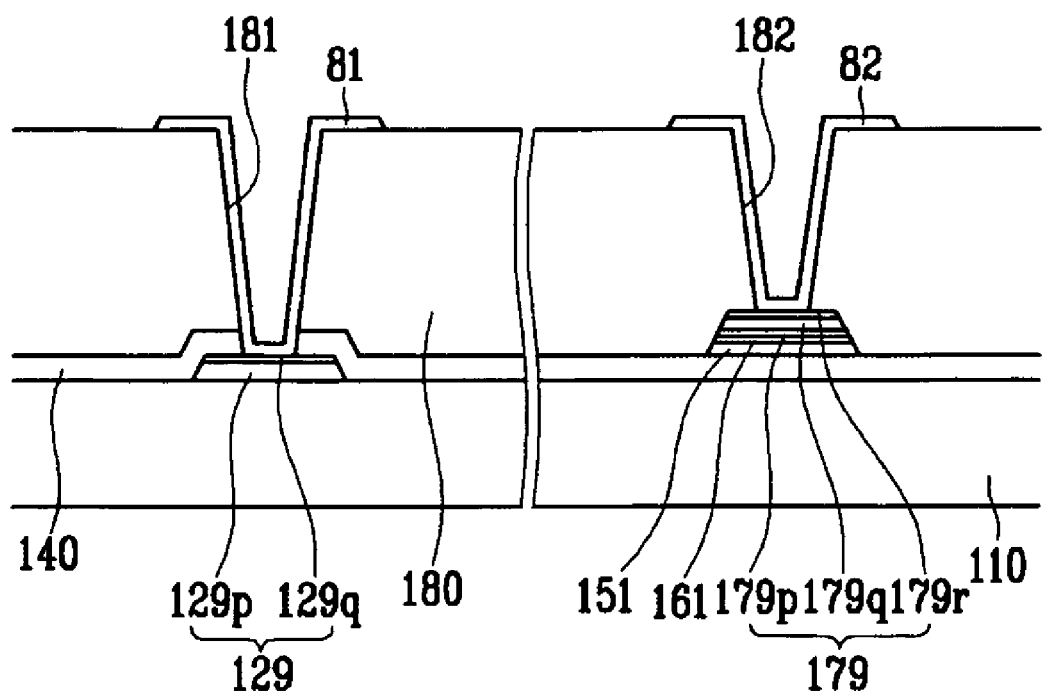

A thin film transistor (TFT) array panel according to an embodiment of the present invention will now be described in detail with reference to FIGS. 1 to 3. FIG. 1 is a layout view of a TFT array panel according to an exemplary embodiment of the present invention, and FIGS. 2 and 3 are cross-sectional views respectively taken along the lines II-II' and III-III' of the TFT array panel of FIG. 1.

A plurality of gate lines 121 and a plurality of storage electrode lines 131 are formed on an insulation substrate 110 that is made of transparent glass or plastic in one example. The gate lines 121 transmit gate signals and mainly extend in a horizontal direction. The gate lines 121 include a plurality of gate electrodes 124 that protrude downward and ends 129 each having a large area to be connected to other layers or external driving circuits. The storage electrode lines 131 receive a predetermined voltage and include lines that run almost parallel to the gate lines 121 and a plurality of pairs of storage electrodes 133a and 133b. However, the shape and arrangement of the storage electrode lines 131 may vary.

The gate lines 121 and storage electrode lines 131 include lower layers 124p, 131p, 133ap, and 133bp including an aluminum based metal, such as aluminum (Al) or an aluminum alloy, and upper layers 124q, 131q, 133aq, and 133bq including a molybdenum based metal, such as molybdenum (Mo) or a Mo alloy. In FIG. 2, for the gate electrode 124 and the storage electrode line 131, p is added to the reference numerals that denote the lower layers and q is added to the reference numerals that denote the upper layers.

A gate insulation layer 140 made of silicon nitride (SiNx) or silicon oxide (SiOx), in one example, is formed on the gate line 121 and the storage electrode line 131.

A plurality of semiconductor stripes 151 made of hydrogenated amorphous silicon (a-Si) in one example are formed on the gate insulation layer 140. The semiconductor stripes 151 mainly extend in a vertical direction and include a plurality of projections 154 that protrude toward the gate electrodes 124. The width of the semiconductor stripes 151 increases in the vicinity of the gate lines 121 and the storage electrode lines 131 so that the semiconductor stripes 151 substantially cover the gate lines 121 and the storage electrode lines 131.

A plurality of ohmic contact stripes and islands 161 and 165 are formed on the semiconductor stripes 151. In one example, the ohmic contacts 161 and 165 are made of a material such as n+ hydrogenated amorphous silicon doped with n-type impurities such as phosphor (P) with high concentration or silicide. The ohmic contact stripes 161 have a plurality of projections 163 so that the projections 163 and the ohmic contact islands 165 make pairs to be arranged on the projections 154 of the semiconductor stripes 151.

A plurality of data lines 171 and a plurality of drain electrodes 175 are formed on the ohmic contacts 161 and 165. The data lines 171 transmit data signals and mainly extend in the vertical direction to intersect the gate lines 121. The data lines 171 include a plurality of source electrodes 173 that extend toward the gate electrodes 124 and ends 179 each having a large area to be connected to other layers or external driving circuits. The drain electrodes 175 are separated from the data lines 171 and face the source electrodes 173 about the gate electrodes 124.

One gate electrode 124, one source electrode 173, and one drain electrode 175 constitute one TFT together with the projection 154 of one semiconductor stripe 151, and the channel of the TFT is formed in the projection 154 between the source electrode 173 and the drain electrode 175.

The data line 171 has a three-layer structure that includes a lower layer 171p, an intermediate layer 171q, and an upper layer 171r. The drain electrode 175 also has a three-layer structure that includes a lower layer 175p, an intermediate layer 175q, and an upper layer 175r. The lower layers 171p and 175p may be made of a molybdenum based metal, such as pure molybdenum or a molybdenum alloy such as MoN, MoNb, MoV, MoTi, and/or MoW. The intermediate layers 171q and 175q may be made of aluminum or an aluminum alloy such as AlNd that has low resistivity. The upper layers 171r and 175r may be made of a molybdenum based metal, such as pure molybdenum or a molybdenum alloy such as MoN, MoNb, MoV, MoTi, and/or MoW that is easily connected to ITO or IZO. In general, the sides of the data line 171 are inclined to the substrate, preferably, at an angle of about 30° to 80°. In FIGS. 2 and 3, for the data line 171 and the drain electrode 175, including the source electrode 173 and the end 179, p is added to the reference numerals that denote the lower layers, q is added to the reference numerals that denote the intermediate layers, and r is added to the reference numerals that denote the upper layers.

The ohmic contacts 161 and 165 are positioned on the semiconductor stripe and projection 151 and 154 beneath the data line 171 and the drain electrode 175, respectively, so as to reduce contact resistance therebetween.

The semiconductor stripe 151, excluding the projection 154 in which the TFT is positioned, has substantially the same planar shape as the data line 171, the drain electrode 175, and the ohmic contact layers 161, 163, and 165. That is, the semiconductor stripe 151 is formed under the ohmic contact layers 161, 163, and 165, and the data line 171 and the drain electrode 175 to be exposed between the source electrode 173 and the drain electrode 175. On the other hand, the ohmic contacts 161 and 165 and the semiconductor stripe 151 protrude from the data line 171 and the data electrode 175 based on the surfaces that are connected to the data line 171 and the drain electrode 175. Based on the surfaces where the ohmic contacts and the semiconductor layers are connected to the data line and the drain electrode, the parts that protrude from the data line and the drain electrode will be hereinafter referred to as "semiconductor layer side projections".

The sides of the ohmic contacts and the semiconductor layers are commonly inclined to the substrate, preferably, at an angle of about 30° to 80°. The surfaces where the data line 171 and the drain electrode 175 are connected to the ohmic contacts 161 and 165 are determined as first reference surfaces and the boundaries of the data line 171 and the drain electrode 175 on the first reference surfaces are determined as first lines.

The surfaces where the semiconductor layer and the gate insulation layer are connected to each other are determined as second reference surfaces and the boundaries of the semiconductor layer on the second reference surfaces are determined as second lines. Virtual tangent surfaces (tangent lines) that are connected to the sides of the semiconductor layer on the second lines are determined and lines where the virtual tangent surfaces are connected to the first reference surfaces are determined as third lines. At this time, the distance between the first lines and the third lines may be determined as the length of the semiconductor layer side projections. The length of the semiconductor layer side projections is no more than 1.5 μm in one example, with the length being more advantageous as the length is made smaller.

A protective layer (passivation layer) 180 is formed on the data line 171, the drain electrode 175, and the exposed semiconductor stripe 151. The protective layer 180 is made of a non-organic insulator such as silicon nitride or silicon oxide, an organic insulator, and a low dielectric constant insulator. The dielectric constants of the organic insulator and the low dielectric constant are preferably no more than 4.0 in one example. A plurality of contact holes 182 and 185 that expose the ends 179 of the data lines 171 and the drain electrodes 175 are formed in the protective layer 180, and a plurality of contact holes 181 that expose the ends 129 of the gate lines 121 and a plurality of contact holes 184 that expose parts of the storage electrode lines 131 are formed in the protective layer 180 and the gate insulation layer 140.

A plurality of pixel electrodes 191, a plurality of overpasses 84, and a plurality of contact assistants 81 and 82 are formed on the protective layer 180. The pixel electrodes 191, the overpasses 84, and the contact assistants 81 and 82 may be formed of a transparent conductive material, such as ITO and IZO, or a reflective metal, such as aluminum, silver, or an alloy of aluminum and silver.

The pixel electrode 191 is physically and electrically connected to the drain electrode 175 through a contact hole 185 to receive a data voltage from the drain electrode 175. The pixel electrode 191 that receives the data voltage generates an electric field together with a common electrode (not shown) of another display panel (not shown) that receives a common voltage so that the direction of the liquid crystal molecules of the liquid crystal layer (not shown) between the two electrodes is determined. The pixel electrode 191 and the common electrode form a capacitor (hereinafter, referred to as a "liquid crystal capacitor") to sustain the applied voltage after the TFT is turned off.

The contact assistants 81 and 82 are connected to the end 129 of the gate line 121 and the end 179 of the data line 171 through the contact holes 181 and 182, respectively.

Each overpass 84 crosses a gate line 121 and is connected to the exposed part of a storage electrode line 131 and the exposed end of the free end of a storage electrode 133b through a pair of contact holes 184 that are on the opposite sides with the gate line 121 interposed.

Now, a method of manufacturing the TFT array panel illustrated in FIGS. 1 to 3 will be described in detail with reference to FIGS. 4 to 23.

Figure 4:
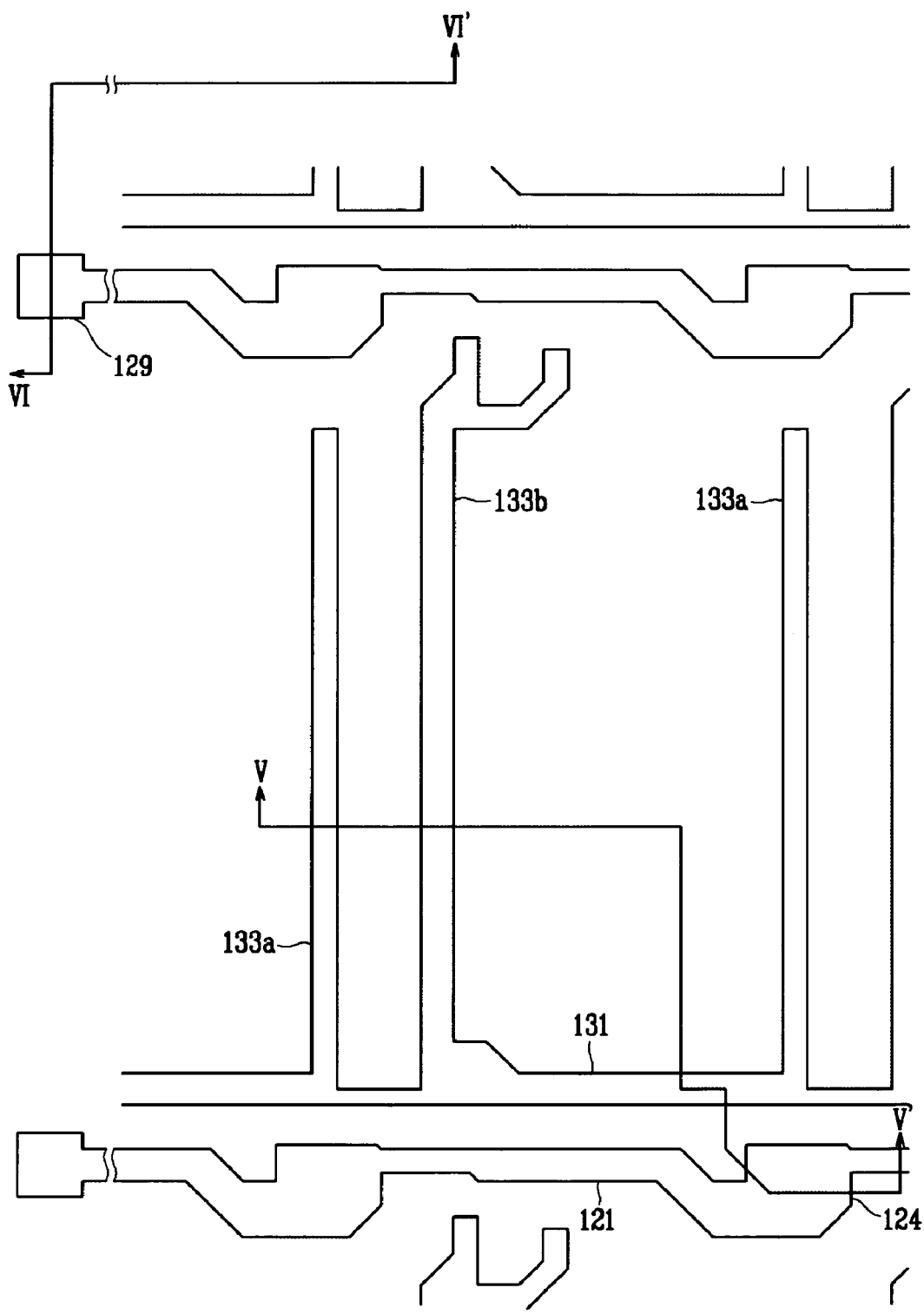
FIGS. 4, 18, and 21 are layout views sequentially illustrating a method of manufacturing a TFT array panel according to the embodiment of the present invention.
Figure 5:
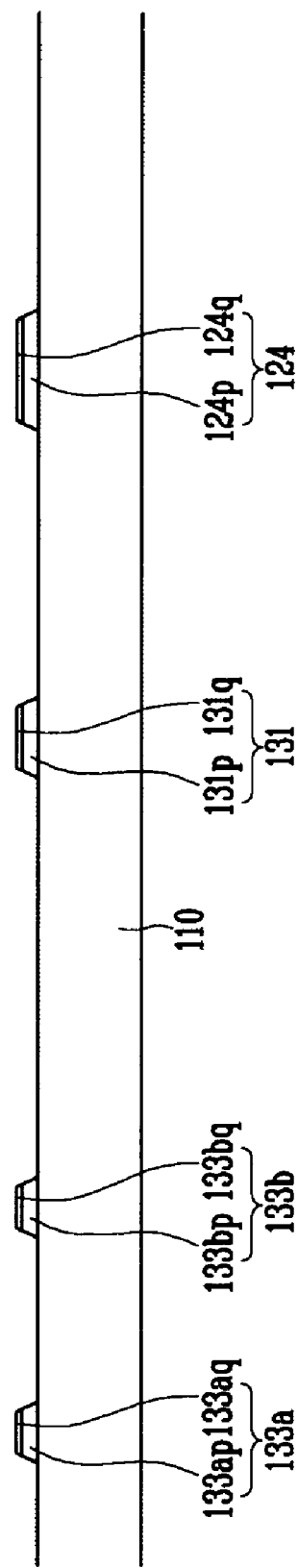
FIGS. 5 and 6 are cross-sectional views respectively taken along the lines V-V' and VI-VI' of the TFT array panel of FIG. 4.
Figure 6:
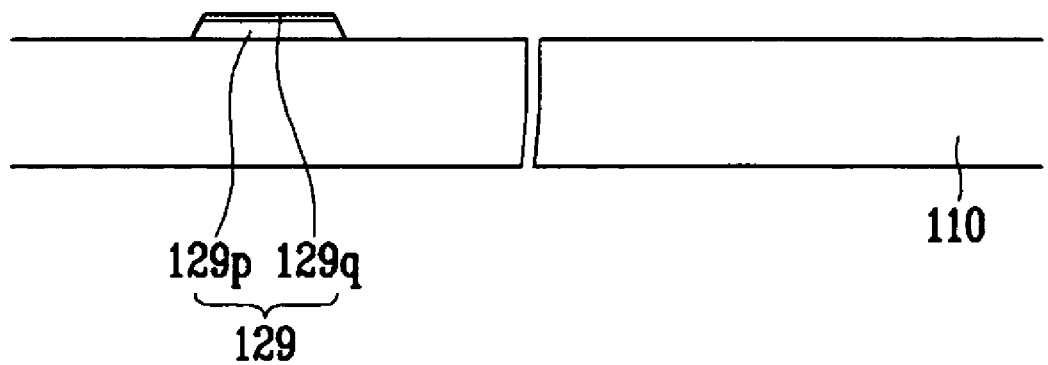
Figure 17:
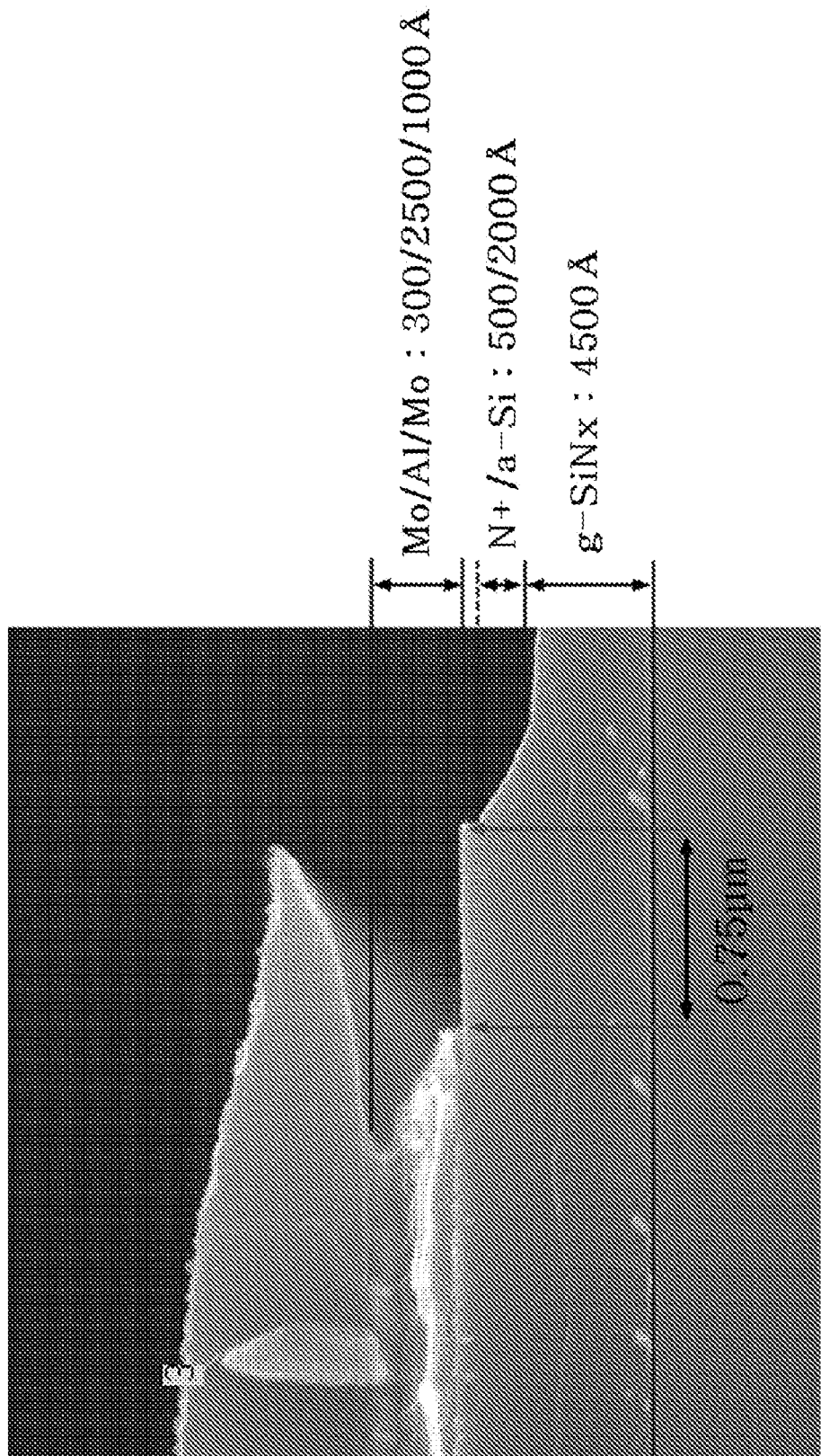
Figure 18:
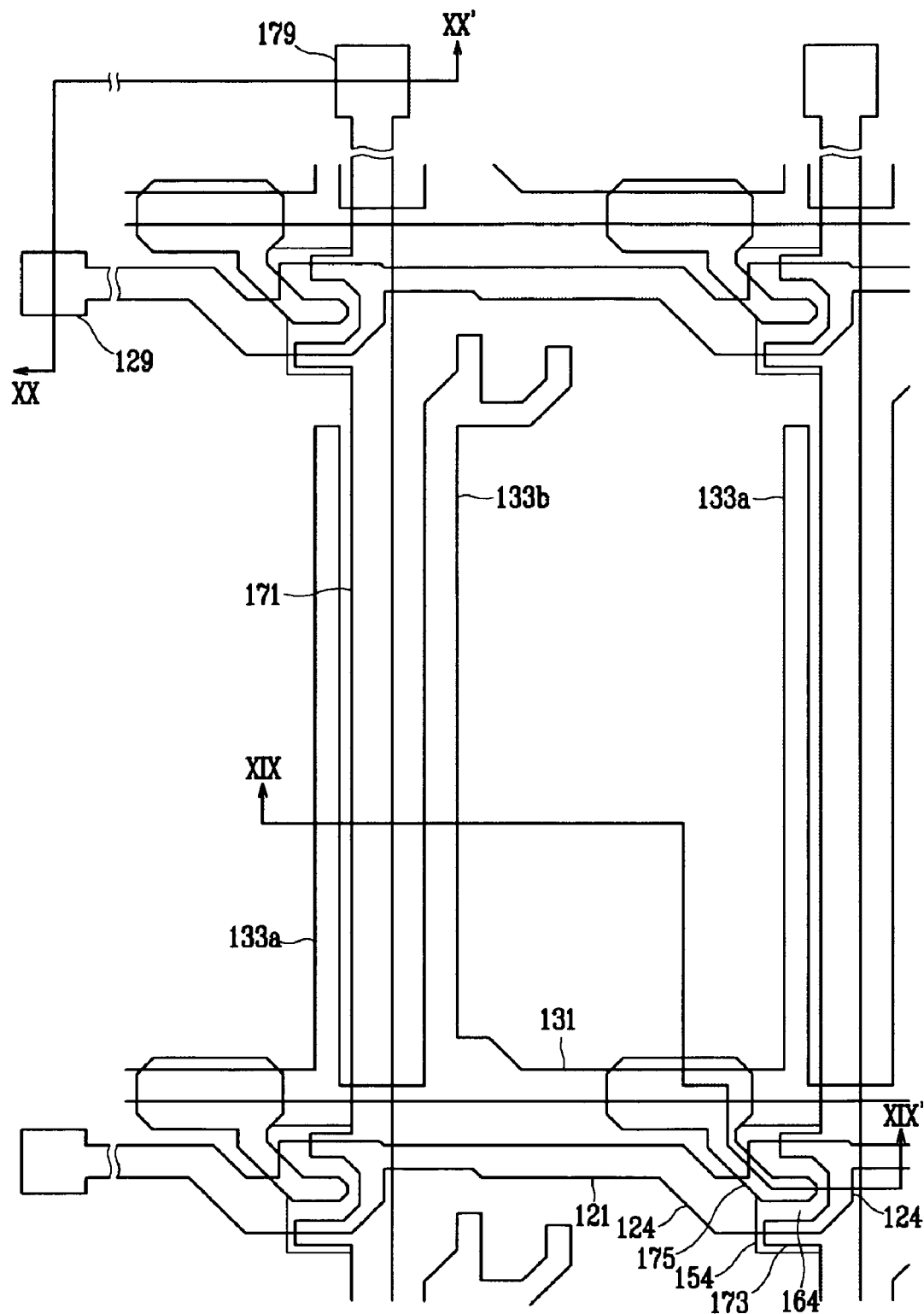
Figure 19:
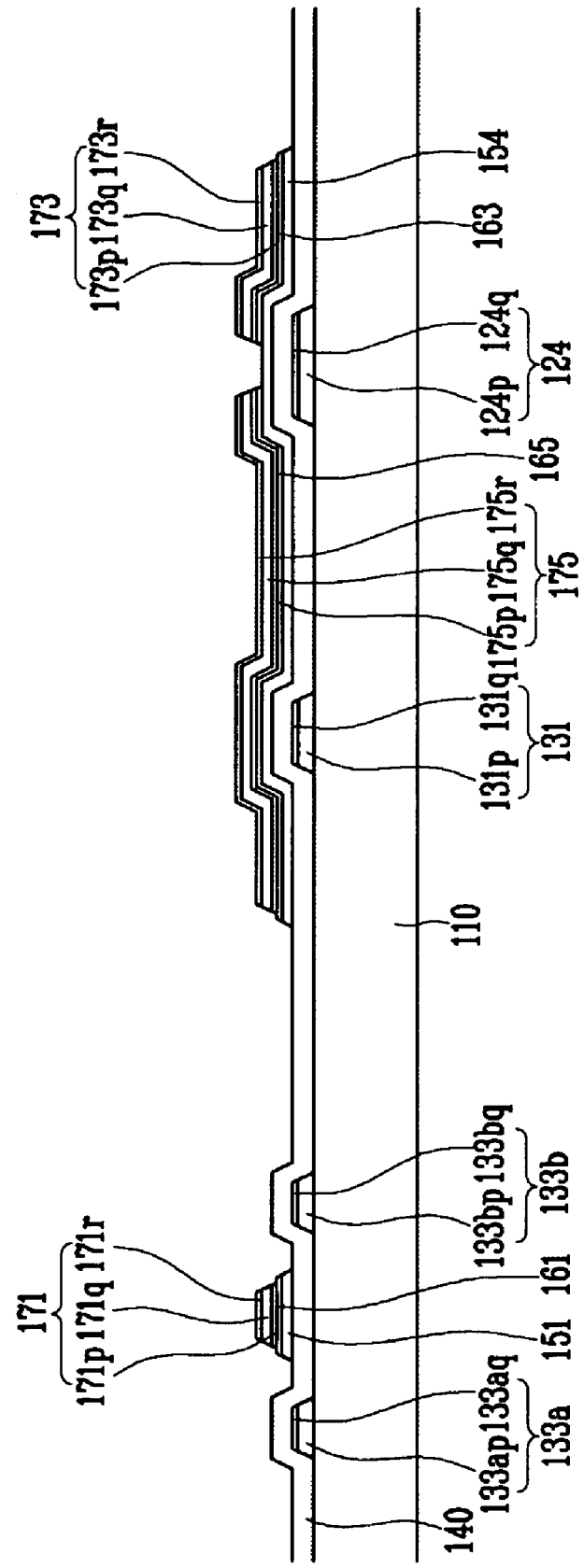
FIGS. 19 and 20 are cross-sectional views respectively taken along the lines XIX-XIX' and XX-XX' of the TFT array panel of FIG. 18.
Figure 20:
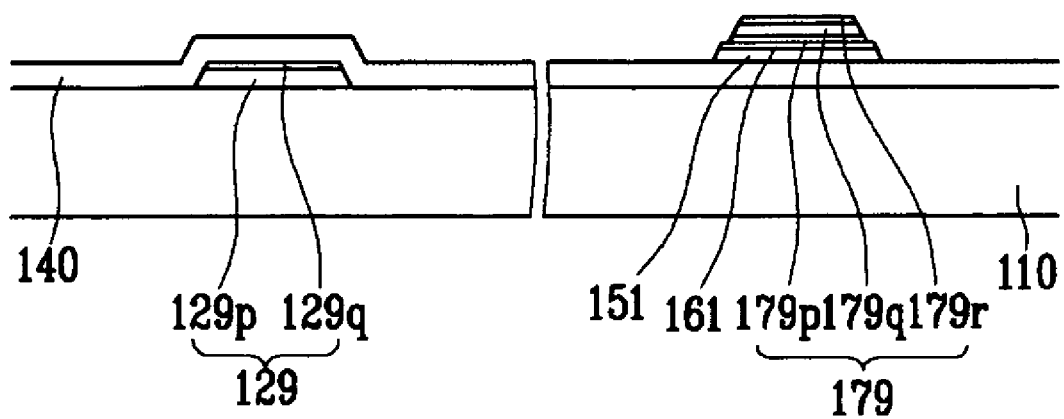
Figure 21:
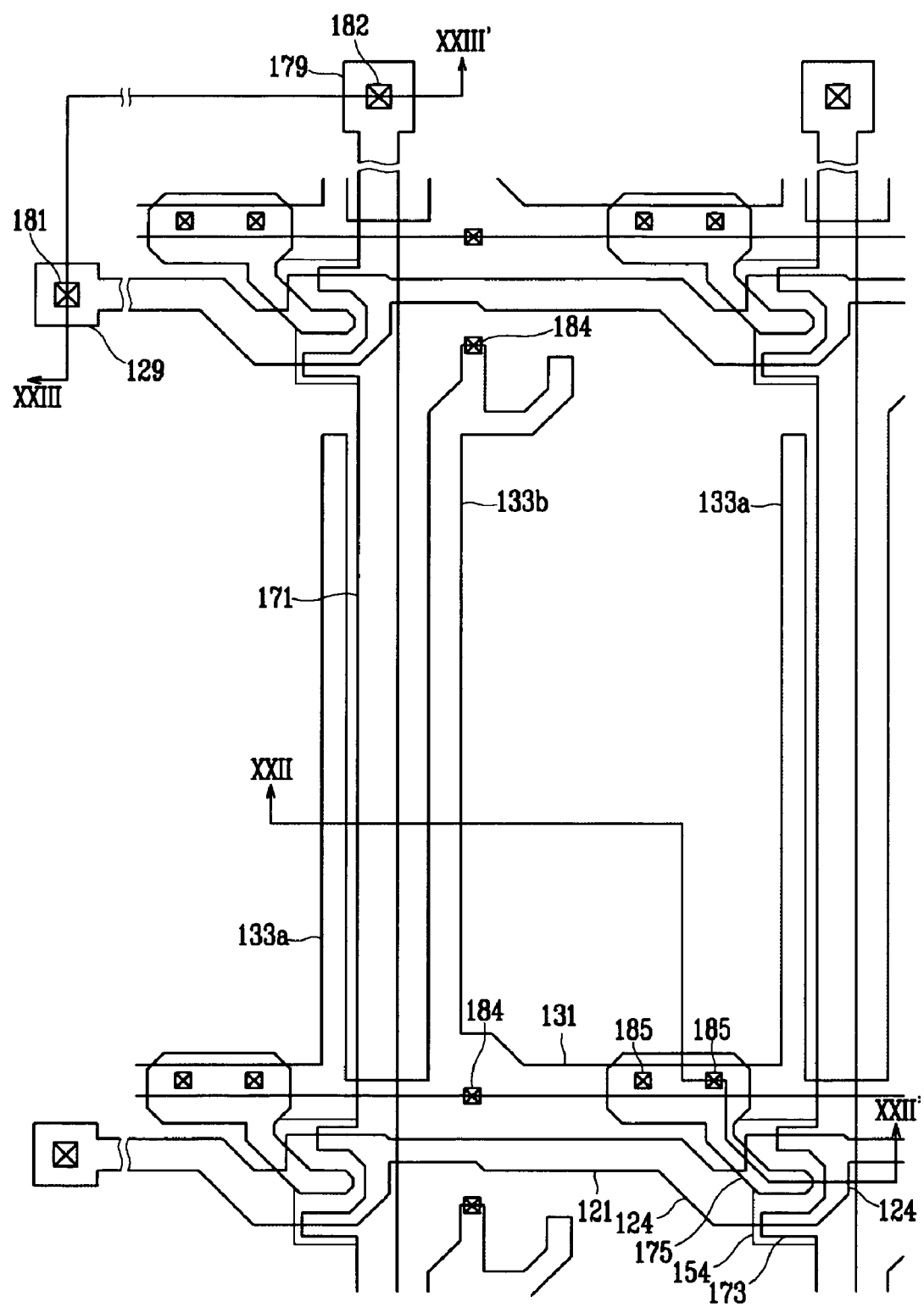
Figure 22:
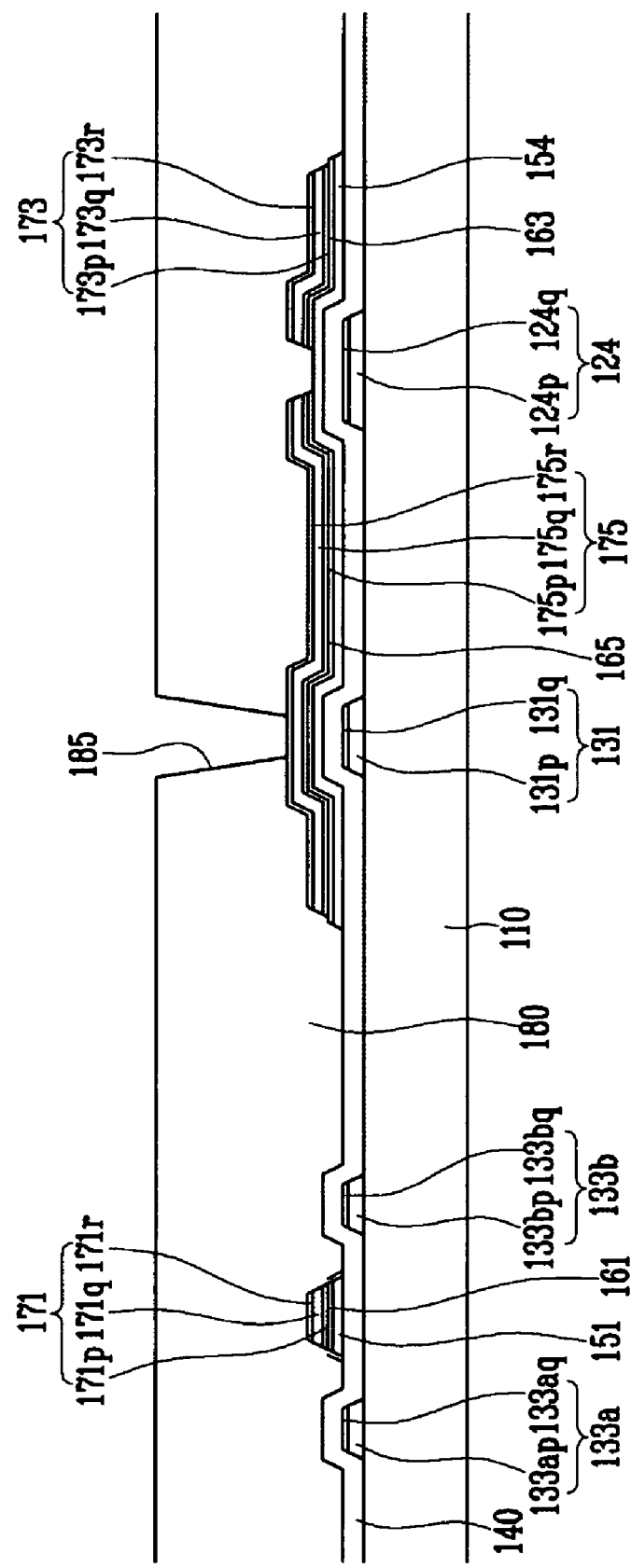
FIGS. 22 and 23 are cross-sectional views respectively taken along the lines XXII-XXII' and XXIII-XXIII' of the TFT array panel of FIG. 21.
Figure 23:
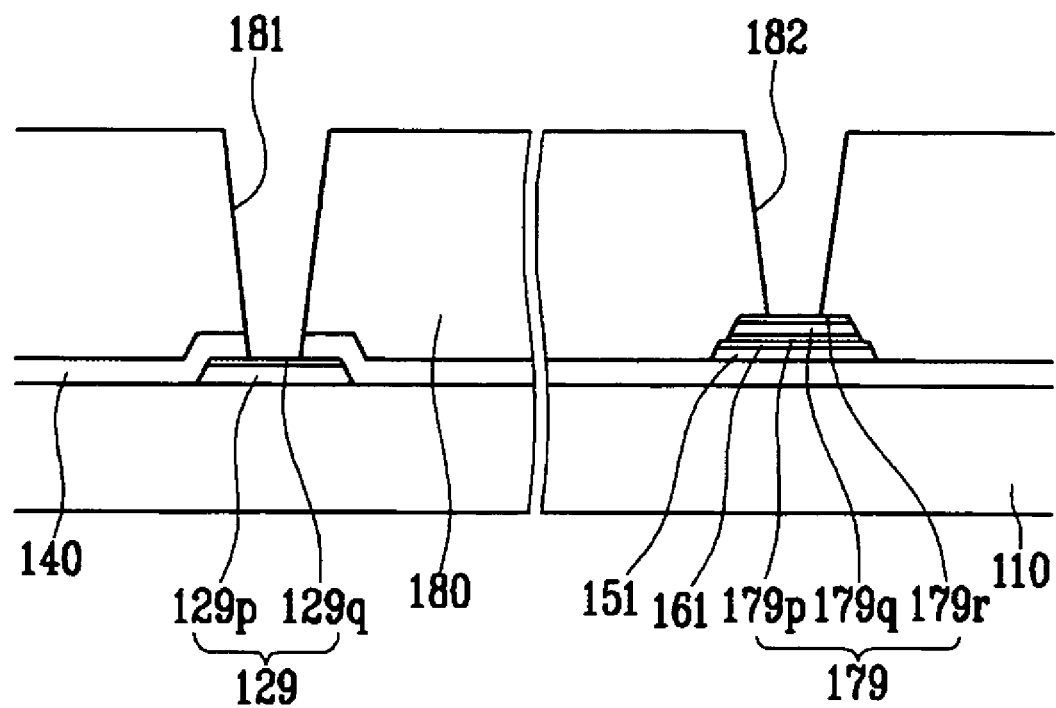

FIGS. 4, 18, and 21 are layout views sequentially illustrating a method of manufacturing a TFT array panel according to an embodiment of the present invention. FIGS. 5 and 6 are cross-sectional views respectively taken along the lines V-V' and VI-VI' of the TFT array panel of FIG. 4. FIGS. 7 to 17 are cross-sectional views sequentially illustrating a method of manufacturing a TFT array panel according to the embodiment of the present invention. FIGS. 19 and 20 are cross-sectional views respectively taken along the lines XIX-XIX' and XX-XX' of the TFT array panel of FIG. 18. FIGS. 22 and 23 are cross-sectional views respectively taken along the lines XXII-XXII' and XXIII-XXIII' of the TFT array panel of FIG. 21.

First, as illustrated in FIGS. 4 to 6, a lower layer made of AlNd and a lower layer made of a molybdenum based metal are sequentially laminated on an insulation substrate 110 made of transparent glass or plastic, in one example. The lower layer and the upper layer are then wet etched to form a plurality of gate lines 121, including gate electrodes 124 and ends 129, and a plurality of storage electrode lines 131, including storage electrodes 133a and 133b.

Figure 7:
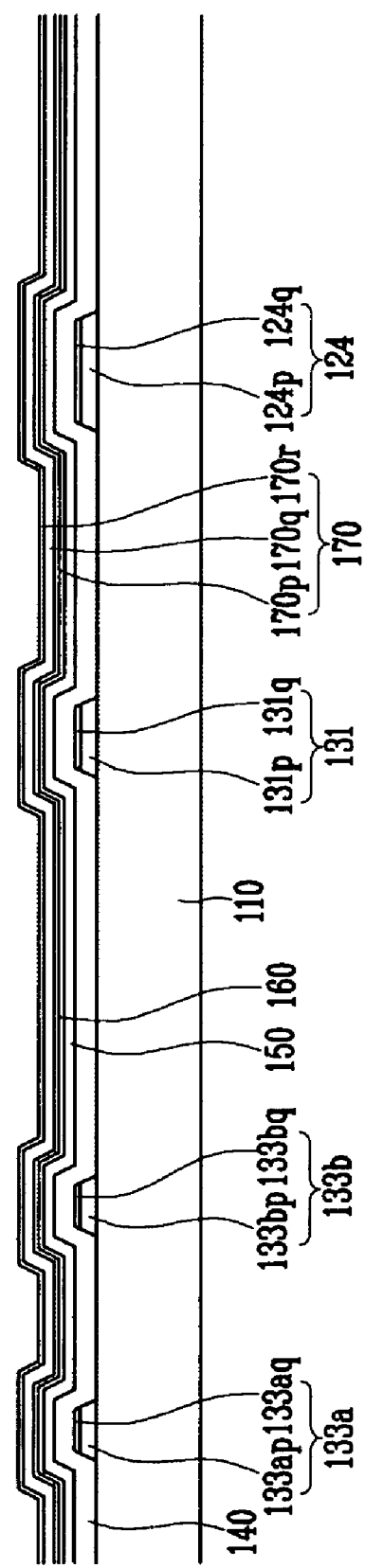
FIGS. 7 to 17 are cross-sectional views sequentially illustrating a method of manufacturing a TFT array panel according to the embodiment of the present invention.
Figure 8:
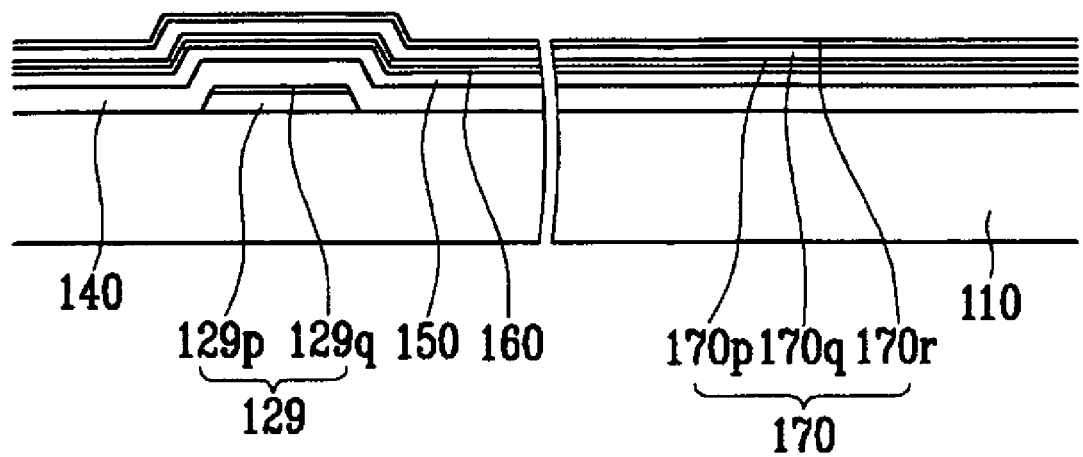

Then, as illustrated in FIGS. 7 and 8, a gate insulation layer 140 made of silicon nitride (SiNx), an intrinsic amorphous silicon (a-Si) layer 150 that is not doped with impurities, and an amorphous silicon (n+ a-Si) layer 160 that is doped with impurities are formed on the gate lines 121 and the storage electrode lines 131 by a plasma enhanced chemical vapor deposition (PECVD) method in one example. The intrinsic amorphous silicon layer 150 is made of hydrogenated amorphous silicon and the amorphous silicon layer 160 that is doped with impurities is made of amorphous silicon that is doped with n-type impurities such as phosphorus (P) with high concentration or silicide.

A metal data layer 170, including a lower molybdenum layer 170p made of a molybdenum based metal, an aluminum layer 170q made of an aluminum based metal, and an upper molybdenum layer 170r made of a molybdenum based metal, are sequentially laminated on the amorphous silicon layer 160 that is doped with impurities by sputtering.

Figure 9:
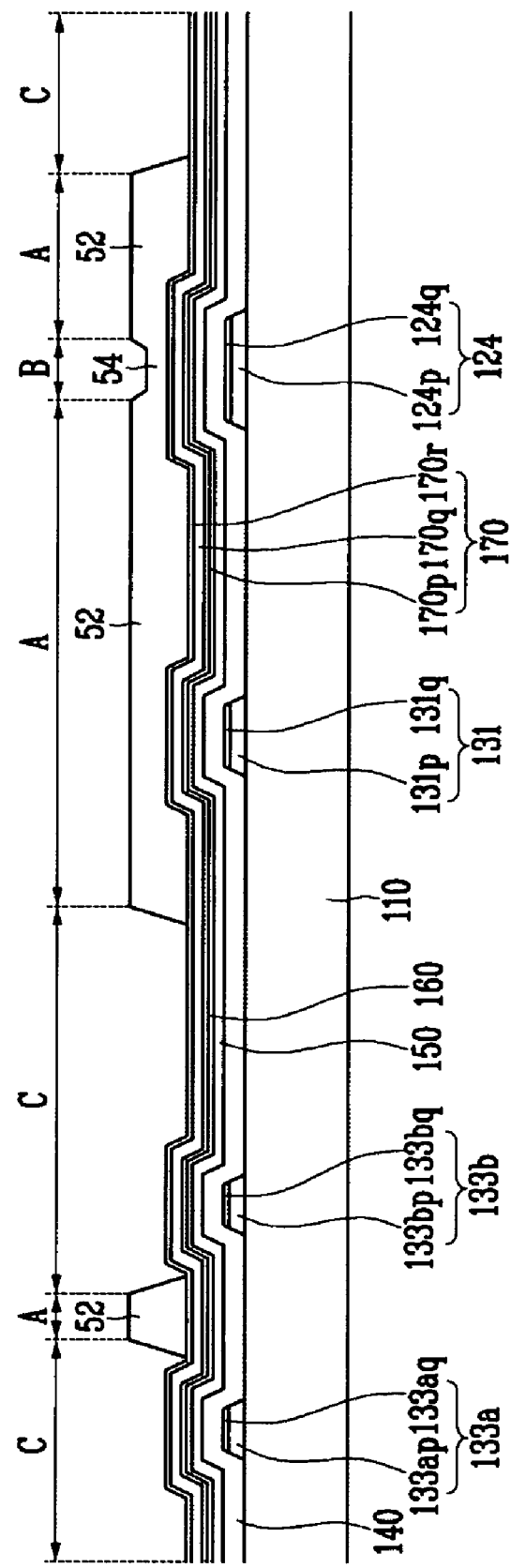
Figure 10:
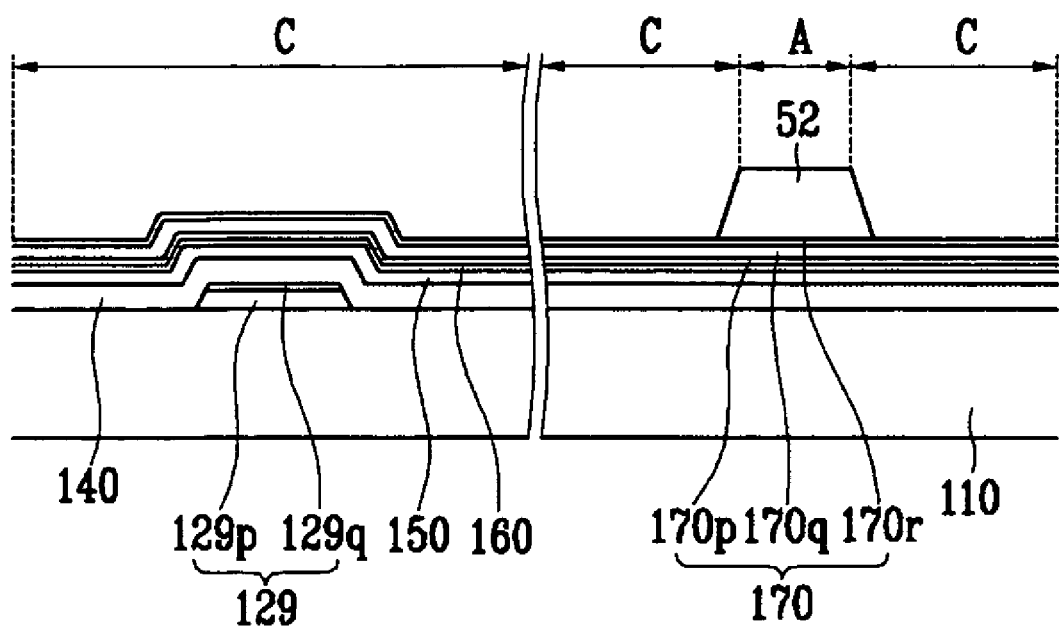

Then, as illustrated in FIGS. 9 and 10, a photosensitive layer pattern formed on the upper molybdenum layer 170r is exposed and developed to form photosensitive layer patterns 52 and 54 having different thicknesses. For convenience sake, the parts of the metal data layer 170, the amorphous silicon layer 160 that is doped with impurities 160, and the intrinsic amorphous silicon layer 150 in which wiring lines are to be formed are referred to as wiring line parts A, the part on the gate electrode 124 where a channel is formed is referred to as a channel part B, and the regions excluding the wiring line parts A and the channel part B are referred to as parts C. In the photosensitive layer pattern, first parts 52 that are positioned in the wiring line parts A are formed to be thicker than a second part 54 that is positioned in the channel part B, and the photosensitive layer pattern in the remaining parts C is removed. The ratio of the thickness of the second part 54 to the thickness of the first parts 52 varies with the conditions of the etching process that will be described later so that the thickness of the second part 54 is preferably no more than ½ of the thickness of the first parts 52 in one example. Various methods may be used for making the thickness of the photosensitive layer pattern vary with position. For example, a semi-transparent region, as well as a transparent region and a light blocking region, may be provided in an exposure mask.

Figure 11:
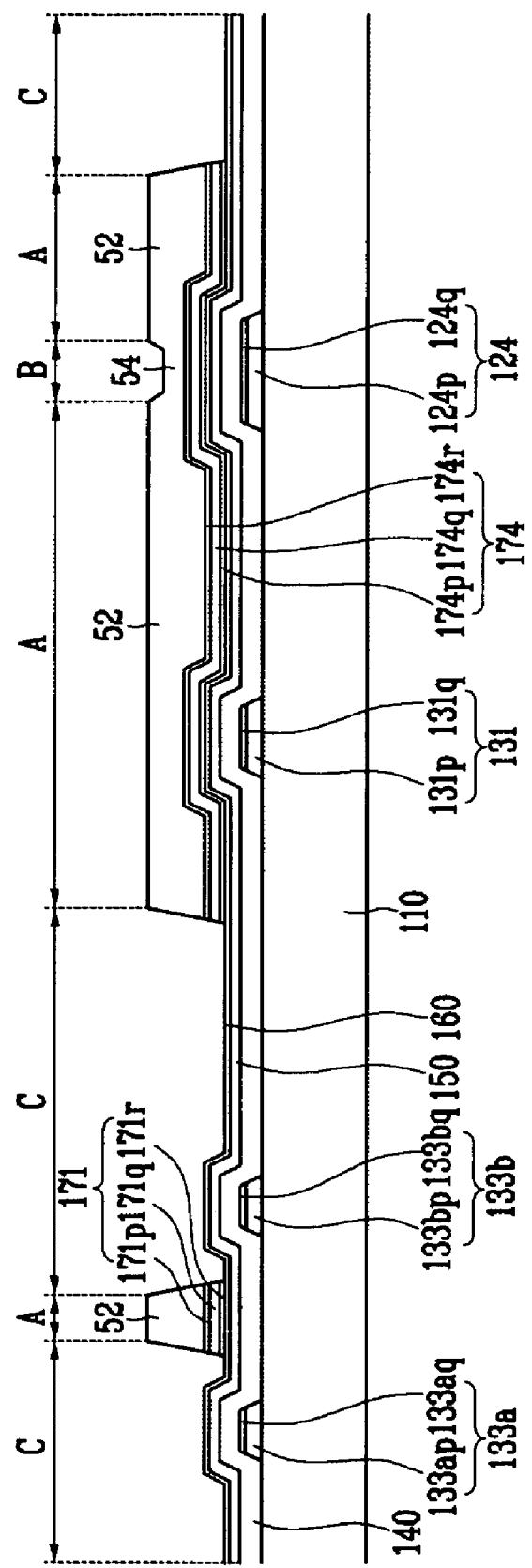
Figure 12:
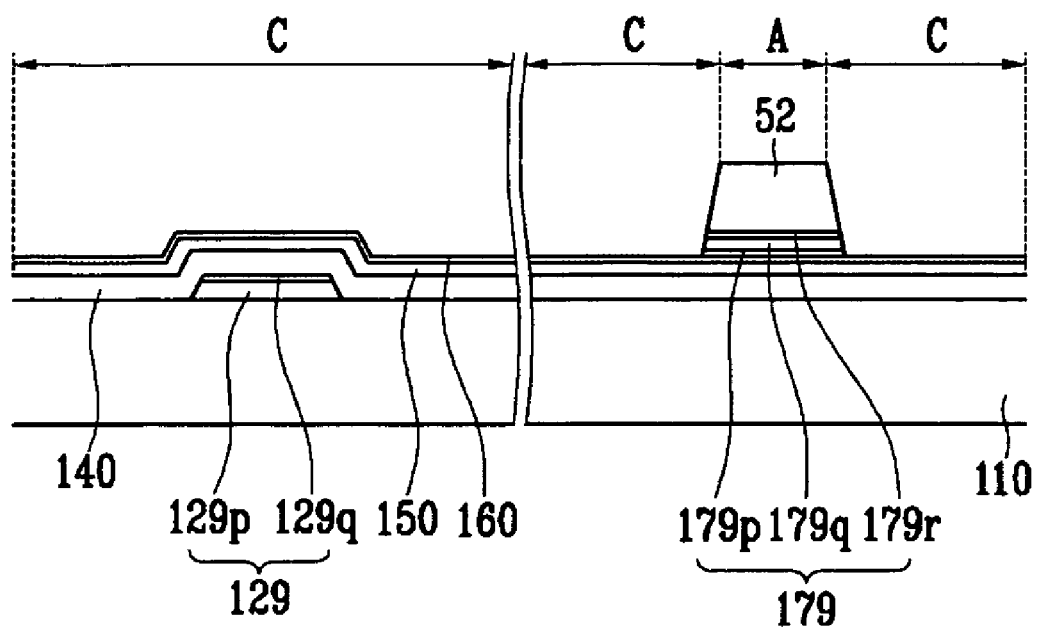

Then, as illustrated in FIGS. 11 and 12, the metal data layer 170 that is exposed to the remaining parts C is removed by wet etching using the first parts 52 of the photosensitive layer pattern.

Figure 13:
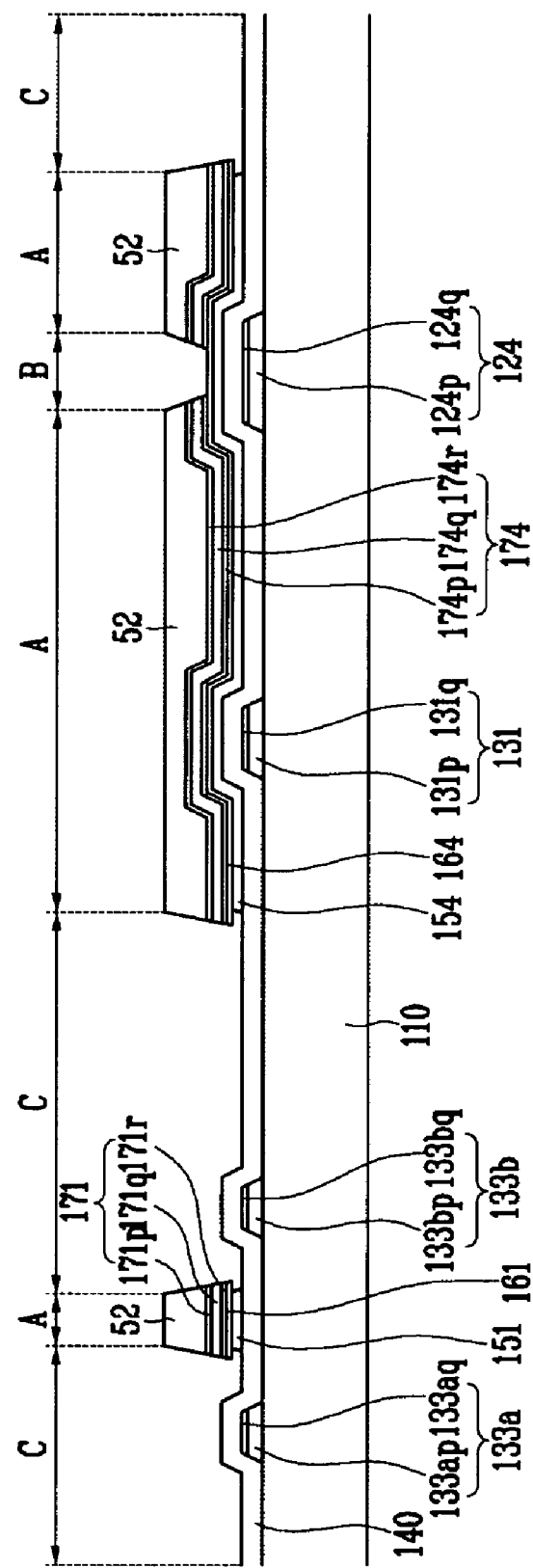
Figure 14:
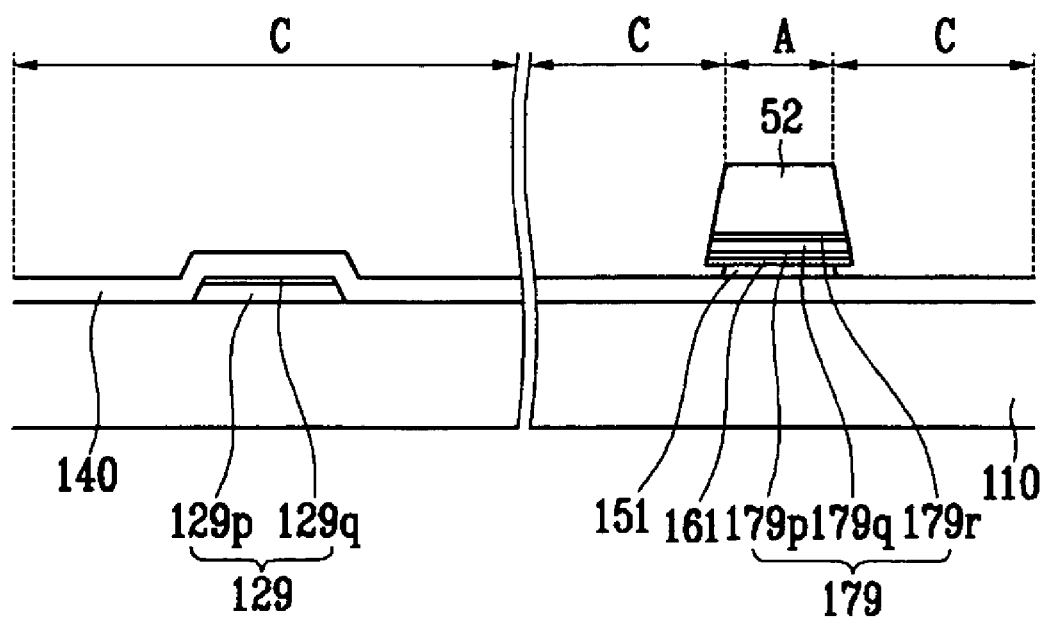

Next, as illustrated in FIGS. 13 and 14, the amorphous silicon layer 160 that is doped with impurities and the intrinsic amorphous silicon layer 150 that reside in the remaining parts C are dry etched using the first parts 52 of the photosensitive layer pattern. In accordance with the present invention, a fluorine containing gas, a chloride containing gas, and an oxygen gas are used as a dry etching gas. The fluorine containing gas may include fluorine atoms (F) such as $SF_6$ and $CF_4$. The chloride containing gas may include chloride atoms (Cl) such as $Cl_2$, HCl, $BCl_3$, $CCl_4$, and $SiCl_2H_2$. The oxygen gas ($O_2$) is supplied together with the fluorine containing gas and the chloride containing gas.

Etching pressure can be properly selected in accordance with a device used, a device mode, and the size of the substrate. For example, the etching process may be performed at the etching pressure of about 100 to 500 mT in a PE mode device. More preferably, the etching process is performed at the etching pressure of 200 mT. Also, in an RIE mode device, the etching process may be performed at the etching pressure of about 5 to 30 mT.

When $SF_6$, HCl, and $O_2$ are used together, the flow ratio between $SF_6$ and $O_2$ is preferably about 4:1 to 1:1. More preferably, the flow ratio between $SF_6$ and $O_2$ is about 2:1. The flow ratio between $SF_6$ and HCl may be about 1:1 to 5:1; however, it is preferably sustained as 5:1. When the amorphous silicon layer 160 and the intrinsic amorphous silicon layer 150 are dry etched at the above-described ratio examples, it is possible to improve the characteristics of the TFT.

As described above, when the metal data layer 170 and the intrinsic amorphous silicon layer 150 are etched using the same photosensitive layer pattern, the data lines 171, including the source electrodes 173 and the ends 179, and the semiconductor stripes 151, including the projections 154, have the same planar shape. However, as a result, the semiconductor stripes 151 formed in a liquid crystal display (LCD) have semiconductor layer side projections that protrude from the data lines 171 and the drain electrodes 175 based on the surfaces that are connected to the data lines 171 and the drain electrodes 175.

Therefore, according to the present invention, in the process of dry etching the amorphous silicon layer 160, which is doped with impurities, and the intrinsic amorphous silicon layer 150 that reside in the remaining parts C using the first parts 52 of the photosensitive layer pattern, the flow ratio among the fluorine containing gas, the chloride containing gas, and the oxygen gas is controlled to be in a predetermined range to reduce the length of the semiconductor layer side projections.

Thereafter, the second part 54 of the photosensitive layer pattern that is positioned in the channel part B is removed using an etch back process. During this process, the thickness of the first parts 52 of the photosensitive layer pattern is reduced to some extent.

Figure 15:
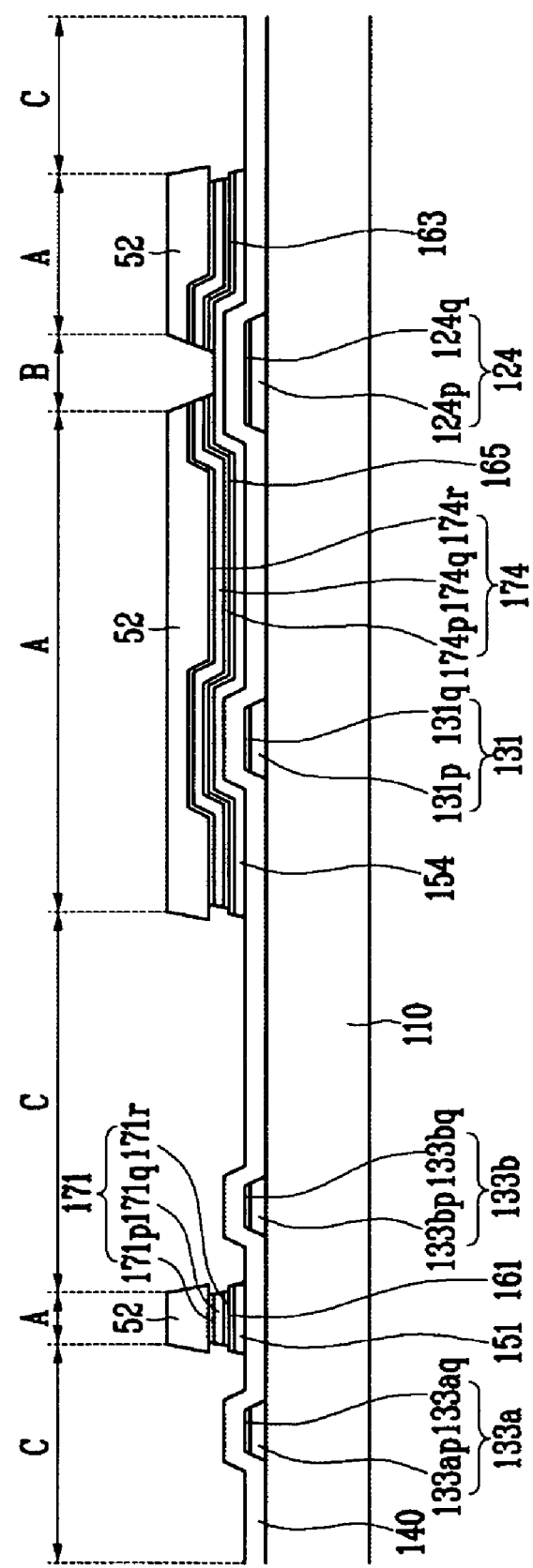
Figure 16:
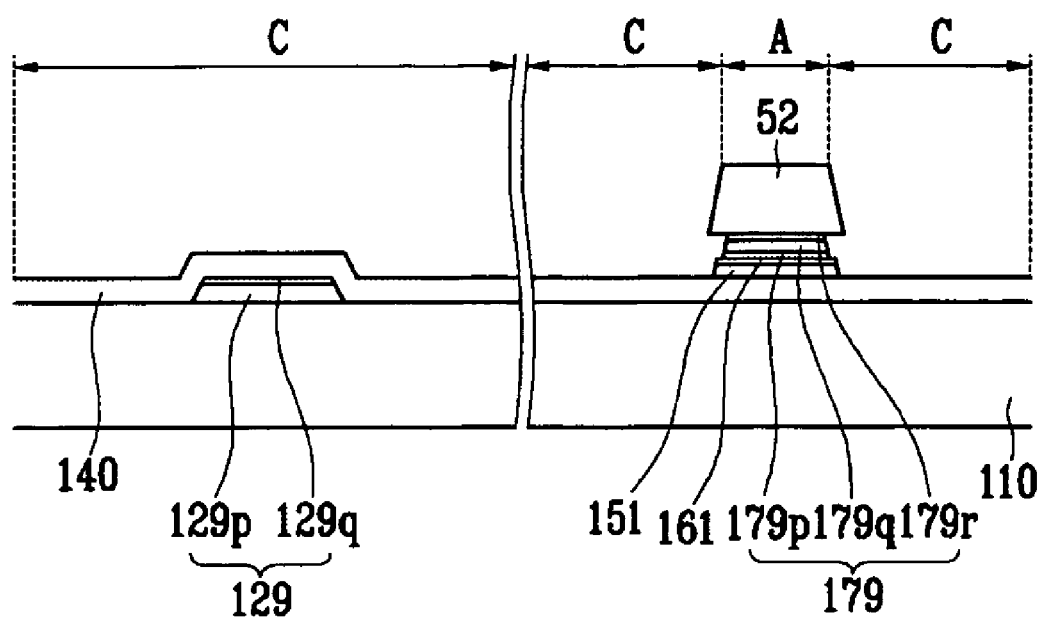

Next, as illustrated in FIGS. 15 and 16, wet etching is performed using the first parts 52 of the photosensitive layer pattern from which the second part 54 is removed to divide the metal data pattern 174 into the source electrode 173 and the drain electrode 175 (see, e.g., FIG. 2). Then, an amorphous silicon pattern 164 (FIG. 13) that is doped with impurities is exposed to the channel region between the source electrode 173 and the drain electrode 175.

At this time, since the sides of the metal data pattern 174 under the photosensitive layer pattern are exposed to the wet etchant, the sides of the metal data pattern 174 are etched. Therefore, the semiconductor layer side projections that protrude based on the surfaces where the semiconductor stripes 151 are connected to the data lines 171 and the drain electrodes 175 are generated. According to the present invention, the ratio of the etching gas is controlled in the process of dry etching the intrinsic amorphous silicon layer and the amorphous silicon layer to first etch the intrinsic amorphous silicon layer and the amorphous silicon layer inward so that it is possible to reduce the semiconductor layer side projections.

Next, the amorphous silicon pattern 164 (FIG. 13) that is doped with impurities and is positioned in the channel region is dry etched using the first parts 52 of the photosensitive layer pattern as an etching mask.

FIG. 17 illustrates the lengths of the semiconductor layer side projections that are formed when the flow amounts of dry etching gases $SF_6$, HCl, and $O_2$ are 100 sccm, 20 sccm, and 50 sccm, respectively. Referring to FIG. 17, the thickness of the gate insulation layer that was formed at an initial stage was 4,500 Å; however, it is noted that the thickness of the residing gate insulation layer is reduced.

Table 1 illustrates experimental examples of the thickness of the semiconductor layer side projections and the residing gate insulation layers when the amorphous silicon layer and the intrinsic amorphous silicon layer are etched with different flow ratios between the fluorine containing gas and the oxygen gas that are used in accordance with an embodiment of the present invention.

In the experimental examples, the supply amount of HCl was sustained at 20 sccm. Also, in the device in the PE mode, the experiment was performed under the conditions of 200 mT and 400 W. The flow amount of $SF_6$ (i.e., the fluorine containing gas) was sustained at 100 sccm, and the flow amount of the oxygen gas ($O_2$) was controlled in the range of 25 sccm to 100 sccm to supply $SF_6$ and $O_2$.

TABLE 1

| $SF_6:O_2$ | Length of semiconductor layer side projections | Amount of residing lower gate insulation layer | Thickness of etched gate insulation layer (initial thickness-residing amount) | Etching characteristics |
|---|---|---|---|---|
| 5:1 | ≧2 μm | 3,680 Å | 820 Å | Standard |
| 4:1 | About 1.4 μm | 2,960 Å | 1,540 Å | Reduction in the length of projections by 30% Good in terms of the amount of residing lower g-SiNx |
| 2:1 | About 0.75 μm | 2,460 Å | 2,040 Å | Reduction in the length of projections by 60% Good in terms of the amount of residing lower g-SiNx |
| 1:1 | About 0.4 μm | 2,060 Å | 2,440 Å | Reduction in the length of projections by 80% Good in terms of the amount of residing lower g-SiNx; however, unstable in terms of margin |

As illustrated in Table 1, when the flow ratio between $SF_6$ and $O_2$ is 4:1 to 1:1, the lengths of the semiconductor layer side projections are reduced. Therefore, it is expected that an after image is reduced. According to the ratio of oxygen contained in the dry etching gas, the length of the semiconductor layer side projections can be reduced; however, the thickness of the residing gate insulation layer is also reduced. When the flow ratio between $SF_6$ and $O_2$ is 4:1 to 1:1, the gate insulation layer is etched to about 1,540 Å to 2,440 Å. However, the thickness of the residing lower gate insulation layer is sustained at no less than 2,000 Å. When the thickness of the residing lower gate insulation layer is no more than 2,000 Å, a short circuit between the gate lines and the data lines may be generated.

In general, the oxygen gas is used for anisotropic etching and the etching rate in a direction parallel to the substrate increases as the amount of the oxygen gas increases. Therefore, when the amount of oxygen gas used during the dry etch is increased, the amorphous silicon layer 160 and the intrinsic amorphous silicon layer 150 are etched inward based on the metal data layer 170. Therefore, it is possible to reduce the length of the semiconductor layer side projections that are formed in the LCD.

The ratio of the chloride containing gas may vary. However, in order to improve the effect of the anisotropic etching that is caused by the oxygen gas, the flow ratio between the fluorine containing gas and the chloride containing gas is preferably in the range of about 1:1 to 5:1. According to an embodiment of the present invention, the flow ratio between the fluorine containing gas and the chloride containing gas is 5:1.

In another embodiment, when the fluorine containing gas, the chloride containing gas, and the oxygen gas are mixed with each other, the flow ratio between the fluorine containing gas and the oxygen gas may change in the range of 4:1 to 1:1 in accordance with time.

As illustrated in FIGS. 18, 19, and 20, the first parts 52 of the photosensitive layer pattern are then removed.

Next, the protective layer 180 is formed to cover the semiconductor projection 154 that is not covered with the data line 171 and the drain electrode 175, as illustrated in FIGS. 21 to 23. Then, the protective layer 180 is etched by a lithographic process to form a plurality of contact holes 181, 182, 184, and 185.

Finally, as illustrated in FIGS. 1 to 3, after depositing a transparent conductive material such as ITO or IZO on the protective layer 180 by sputtering, the conductive material is patterned to form the pixel electrodes 191, the contact assistants 81 and 82, and the overpasses 84.

As described above, the data lines are made of a multi-layer film including an aluminum layer and a molybdenum layer and the ohmic contact layers and the semiconductor layers are etched by an etching gas with a predetermined flow ratio so that it is possible to improve the characteristics of the TFT and to prevent the generation of an after image.

While embodiments of the present invention have been described in detail above, it will be understood by those skilled in the art that various changes in form and details may be made therein without departing from the spirit and scope of the present invention. For example, although the present invention was described above based on four processes, the present invention can be used for three processes. Accordingly, the scope of the invention is defined only by the following appended claims.

What is claimed is:

1. A method of manufacturing a thin film transistor (TFT) array panel, the method comprising:

forming a semiconductor layer and an ohmic contact layer over a gate line on a substrate;

forming a conductive layer on the ohmic contact layer;

forming a first photosensitive layer pattern on the conductive layer;

etching the conductive layer using the first photosensitive layer pattern as an etching mask, so as to form an etched surface of the conductive layer, the ohmic contact layer and the semiconductor layer having a projection portion protruding from the etched surface and a covered portion covered by the conductive layer;

etching back the projection portion and etching the covered portion from under the conductive layer with a fluorine-containing gas, a chloride-containing gas, and an oxygen ($O_2$) gas using the first photosensitive layer pattern as an etching mask;

removing the first photosensitive layer pattern to a predetermined thickness to form a second photosensitive layer pattern; and etching the conductive layer using the second photosensitive layer pattern as an etching mask to expose a part of the ohmic contact layer.

2. The method of claim 1, further comprising forming a gate insulation layer between the gate line and the semiconductor layer.

3. The method of claim 2, wherein the thickness of the gate insulation layer that remains after etching the ohmic contact layer and the semiconductor layer with the fluorine-containing gas, the chloride-containing gas, and the oxygen ($O_2$) gas using the first photosensitive layer pattern as the etching mask is no less than 2,000 Å.

4. The method of claim 2, wherein when the ohmic contact layer and the semiconductor layer are etched with the fluorine-containing gas, the chloride-containing gas, and the oxygen ($O_2$) gas using the first photosensitive layer pattern as the etching mask, the thickness of the etched gate insulation layer is 1,200 Å to 2,500 Å.

5. The method of claim 1, wherein the flow ratio between the fluorine-containing gas and the oxygen ($O_2$) gas is in the range of about 4:1 to about 1:1.

6. The method of claim 1, wherein the flow ratio between the fluorine-containing gas and the oxygen ($O_2$) gas is about 2:1.

7. The method of claim 5, wherein the flow ratio between the fluorine-containing gas and the chloride-containing gas is about 5:1.

8. The method of claim 5, wherein:

the fluorine-containing gas comprises at least one gas selected from the group consisting of $SF_6$ and $CF_4$; and the chloride containing-gas comprises at least one gas selected from the group consisting of HCl, $Cl_2$, $CCl_4$, $BCl_3$, and $SiCl_2H_2$.

9. The method of claim 5, wherein the ohmic contact layer and the semiconductor layer are etched using the first photosensitive layer pattern as the etching mask under a pressure of about 100 mT to about 500 mT.

10. The method of claim 1, wherein the flow ratio between the fluorine-containing gas and the oxygen gas changes in the range of about 4:1 to about 1:1 in accordance with time.

11. The method of claim 1, wherein the conductive layer comprises a first conductive layer containing molybdenum (Mo), a second conductive layer containing aluminum (Al), and a third conductive layer containing molybdenum (Mo).

12. The method of claim 11, wherein the conductive layer is wet etched.

13. A method of manufacturing a thin film transistor (TFT) array panel, the method comprising:

forming gate lines on a substrate;
forming a gate insulation layer, a semiconductor layer, and an ohmic contact layer on the gate lines;
forming a conductive layer on the ohmic contact layer;
forming a first photosensitive layer pattern on the conductive layer;
etching the conductive layer using the first photosensitive layer pattern as an etching mask;
etching the ohmic contact layer and the semiconductor layer by a fluorine-containing gas, a chloride-containing gas, and an oxygen ($O_2$) gas using the first photosensitive layer pattern as an etching mask, wherein the flow ratio between the fluorine-containing gas and the oxygen gas is in the range of about 4:1 to about 1:1;
removing the first photosensitive layer pattern to a predetermined thickness to form a second photosensitive layer pattern; and
etching the conductive layer using the second photosensitive layer pattern as an etching mask to expose a part of the ohmic contact layer.

14. The method of claim 13, wherein the flow ratio between the fluorine-containing gas and the oxygen gas is about 2:1.

15. The method of claim 13, wherein:
the fluorine-containing gas comprises at least one gas selected from the group consisting of $SF_6$ and $CF_4$; and
the chloride-containing gas comprises at least one gas selected from the group consisting of HCl, $Cl_2$, $CCl_4$, $BCl_3$, and $SiCl_2H_2$.

16. The method of claim 13, wherein the flow ratio between the fluorine-containing gas and the oxygen gas changes in the range of 4:1 to 1:1 in accordance with time.

* * * * *